United States Patent
Chien et al.

(10) Patent No.: US 7,417,573 B2
(45) Date of Patent: Aug. 26, 2008

(54) SIGMA-DELTA CIRCUIT AND RELATED METHOD WITH TIME SHARING ARCHITECTURE

(75) Inventors: Hung-Lun Chien, Taipei Hsien (TW); De-Yu Kao, Taipei (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 0 days.

(21) Appl. No.: 11/668,431

(22) Filed: Jan. 29, 2007

(65) Prior Publication Data

US 2008/0055132 A1    Mar. 6, 2008

(30) Foreign Application Priority Data

Sep. 6, 2006   (TW)  .............................. 95132920 A

(51) Int. Cl.
*H03M 3/00*    (2006.01)
(52) U.S. Cl. ...................... 341/143; 341/141
(58) Field of Classification Search ................ 341/141, 341/143
See application file for complete search history.

(56) References Cited

U.S. PATENT DOCUMENTS

| | | | | |
|---|---|---|---|---|
| 5,101,205 A | * | 3/1992 | Yasuda | 341/155 |
| 5,742,246 A | * | 4/1998 | Kuo et al. | 341/143 |
| 5,757,301 A | * | 5/1998 | Kuo et al. | 341/143 |
| 5,805,093 A | * | 9/1998 | Heikkila et al. | 341/143 |
| 6,023,184 A | * | 2/2000 | Little | 327/336 |
| 6,275,177 B1 | * | 8/2001 | Ho et al. | 341/143 |

* cited by examiner

*Primary Examiner*—Khai M Nguyen
(74) *Attorney, Agent, or Firm*—Winston Hsu

(57) ABSTRACT

A sigma-delta circuit with time sharing architecture includes a coefficient generation element, a sigma-delta processing element, and a storage element. The coefficient generation element is used for generating coefficients for sigma-delta operations. The sigma-delta processing element is used for executing sigma-delta operations according to the coefficients generated by the coefficient generation element. The storage element is used for storing results of the sigma-delta operations executed by the sigma-delta processing element. The sigma-delta circuit is used for executing a plurality of orders of sigma-delta operations through the coefficient generation element, the sigma-delta processing element and the storage element.

20 Claims, 10 Drawing Sheets

SIGMA-DELTA CIRCUIT AND RELATED METHOD WITH TIME SHARING ARCHITECTURE

BACKGROUND OF THE INVENTION

1. Field of the Invention

The present invention relates to a sigma-delta circuit and related method, and more particularly, to a sigma-delta circuit and related method with a time sharing architecture.

2. Description of the Prior Art

Recently, audio processing is implemented by general microprocessors such as central processing units (CPU) or digital signal processors (DSP). Another method for audio processing is implemented in field programmable gate arrays (FPGA), due to operational frequency of sigma-delta modulators being low enough to be implemented in FPGA easily. The sigma-delta modulators are already widespreadly applied to analog-to-digital converters (ADC) and digital-to-analog converters (DAC), because of the sigma-delta modulators having a capability of noise shaping to restrain quantized noise within signal bandwidths and to raise the signal to noise ratio further. Hence, the sigma-delta modulators are popular in application circuits with high resolution and middle (or low) speed.

Please refer to FIG. 1. FIG. 1 is a diagram of a first order sigma-delta modulator 10 in the prior art. The first order sigma-delta modulator 10 includes an adder 12, an integrator 13, a quantizer 14, a digital-to-analog converter 16, and a filter 18. Principles of the sigma-delta modulator 10 are rough estimating signals firstly to calculate errors, and then after integration, the errors are further compensated. As shown in FIG. 1, an input signal In1 and a feedback signal $S_{FB}$ of the digital-to-analog converter 16 are inputted into the adder 12 and are subtracted to generate an error signal Se. The error signal Se is integrated by the integrator 13 and then is quantized by the quantizer 14. Due to quantized errors resulting in noise being quantized, the noise should be filtered out by the filter 18 to finally output an output signal Out1.

Please refer to FIG. 2, which is a diagram of a second order sigma-delta modulator 20 in the prior art. The second order sigma-delta modulator 20 includes the adder 12, the integrator 13, a second adder 22, a second integrator 23, the quantizer 14, a digital-to-analog converter 16, and a filter 18. Orders of the sigma-delta modulator 20 depend on amount of feedback loops. As shown in FIG. 2, the input signal In1 and the feedback signal $S_{FB}$ of the digital-to-analog converter 16 are inputted into the adder 12 and are subtracted to generate the error signal Se. The error signal Se is integrated by the integrator 13 to generate an integration signal Si. The integration signal Si and the feedback signal $S_{FB}$ of the digital-to-analog converter 16 are inputted into the second adder 22 and are subtracted, and then are integrated by the second integrator 23 and are quantized by the quantizer 14. Due to quantized errors resulting in noise being quantized, the noise should be filtered out by the filter 18 to finally output the output signal Out1. Hence, the second order sigma-delta modulator 20 totally processes sigma-delta operations two times.

On this account, with the increasing of the orders of the sigma-delta operations, the circuit of the sigma-delta modulators becomes more and more complicated. Please refer to FIG. 3, which is a diagram of a fifth order sigma-delta modulator 30 in the prior art. As shown in FIG. 3, the fifth order sigma-delta operations are executed by a first sigma-delta processing element PE1, a second sigma-delta processing element PE2, a third sigma-delta processing element PE3, a fourth sigma-delta processing element PE4, and a fifth sigma-delta processing element PE5. Each sigma-delta processing element (PE1~PE5) at least includes a multiplier, an adder, and an integrator. For example, the second sigma-delta processing element PE2 includes the multipliers a(2), b(2), g(1), and c(2), the integrator 332, and the adders 321 and 322. As shown in FIG. 3, a first order sigma-delta operation is processed on the input signal In1 by the first sigma-delta processing element PE1, and then a second, a third, a fourth, and a fifth order sigma-delta operations are processed on it sequentially. After finishing five orders of sigma-delta operations, the result is quantized by a quantizer 34 and then is delayed for a clock period by a delay unit 37 to finally output the output signal Out1. The five orders of the sigma-delta operations on the input signal In1 are obtained through the fifth order sigma-delta modulator 30. However, the fifth order sigma-delta modulator 30 needs at least eight adders, eighteen multipliers, and five integrators, which will waste hardware areas.

Direct implementations of audio processing will waste too much hardware areas and cost due to the audio processing only having frequencies of KHz. Hence, most designs are implemented by general microprocessors such as central processing units (CPU) or digital signal processors (DSP) recently, but their hardware cost is too high and will result in raising operational frequencies, which is difficult to be implemented in FPGA. In the prior art, sigma-delta circuits with multiple orders need a lot of adders, multipliers, and integrators. The more orders of the sigma-delta circuits that are used, the more adders, multipliers, and integrators are needed. These elements will increase not only manufacture cost but also hardware areas.

SUMMARY OF THE INVENTION

The claimed invention provides a sigma-delta circuit with a time sharing architecture. The sigma-delta circuit includes a coefficient generation element, a sigma-delta processing element, and a storage element. The coefficient generation element is used for generating coefficients for sigma-delta operations. The sigma-delta processing element is used for executing sigma-delta operations according to the coefficients generated by the coefficient generation element. The storage element is used for storing results of the sigma-delta operations executed by the sigma-delta processing element. The sigma-delta circuit is used for executing a plurality of orders of sigma-delta operations through the coefficient generation element, the sigma-delta processing element and the storage element.

The claimed invention provides a method of utilizing a time sharing architecture to process audio signals in a sigma-delta circuit. The method includes generating coefficients for sigma-delta operations, executing sigma-delta operations according to the coefficients generated for sigma-delta operations, and storing results of the sigma-delta operations. A plurality of orders of sigma-delta operations is executed through the above-mentioned steps. The method further includes receiving a plurality of coefficients, receiving a state signal, and selecting one of the plurality of coefficients to output according to the state signal. The method further includes quantizing the results of the sigma-delta operations.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
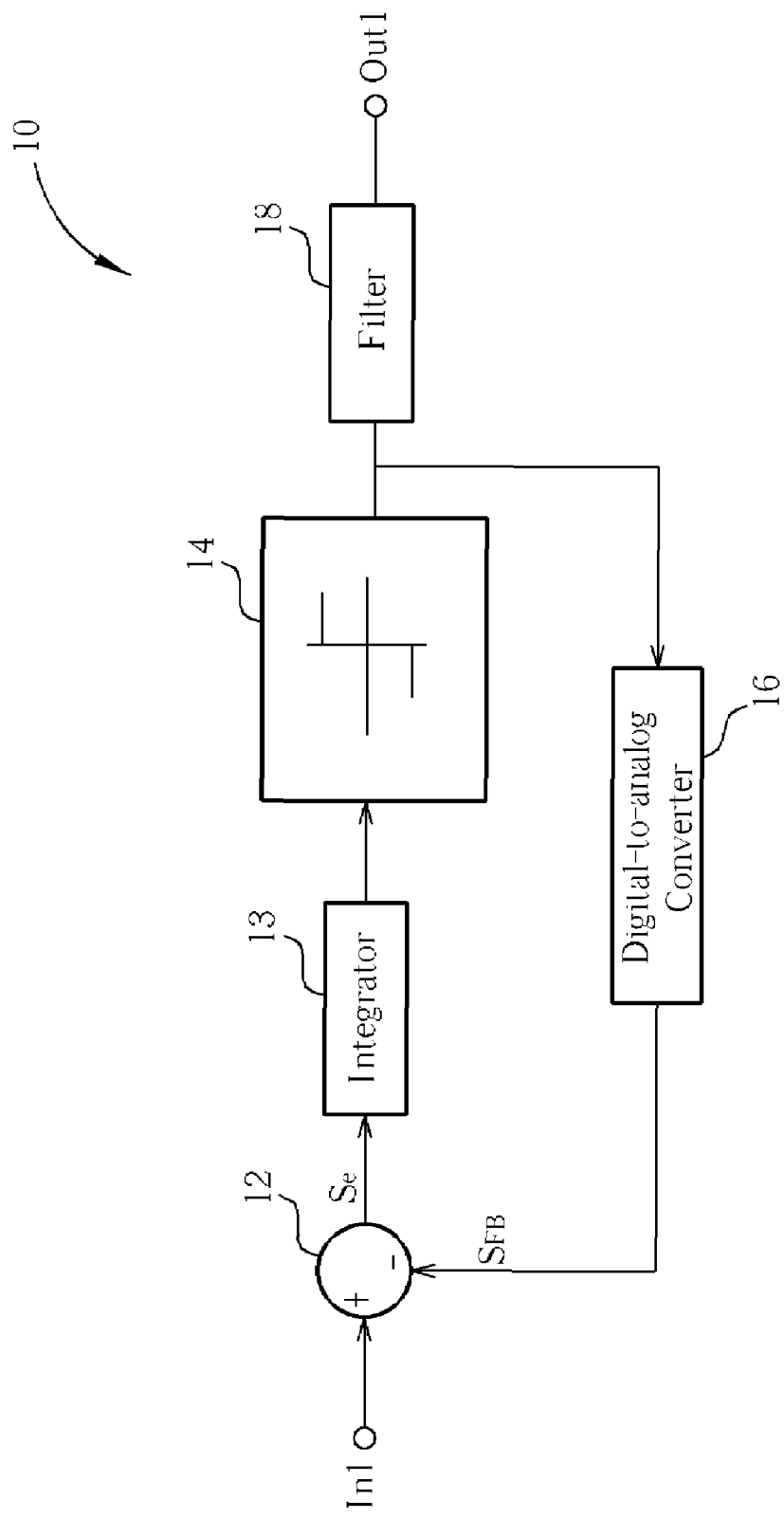
FIG. 1 is a diagram of a first order sigma-delta modulator in the prior art.
Figure 2:
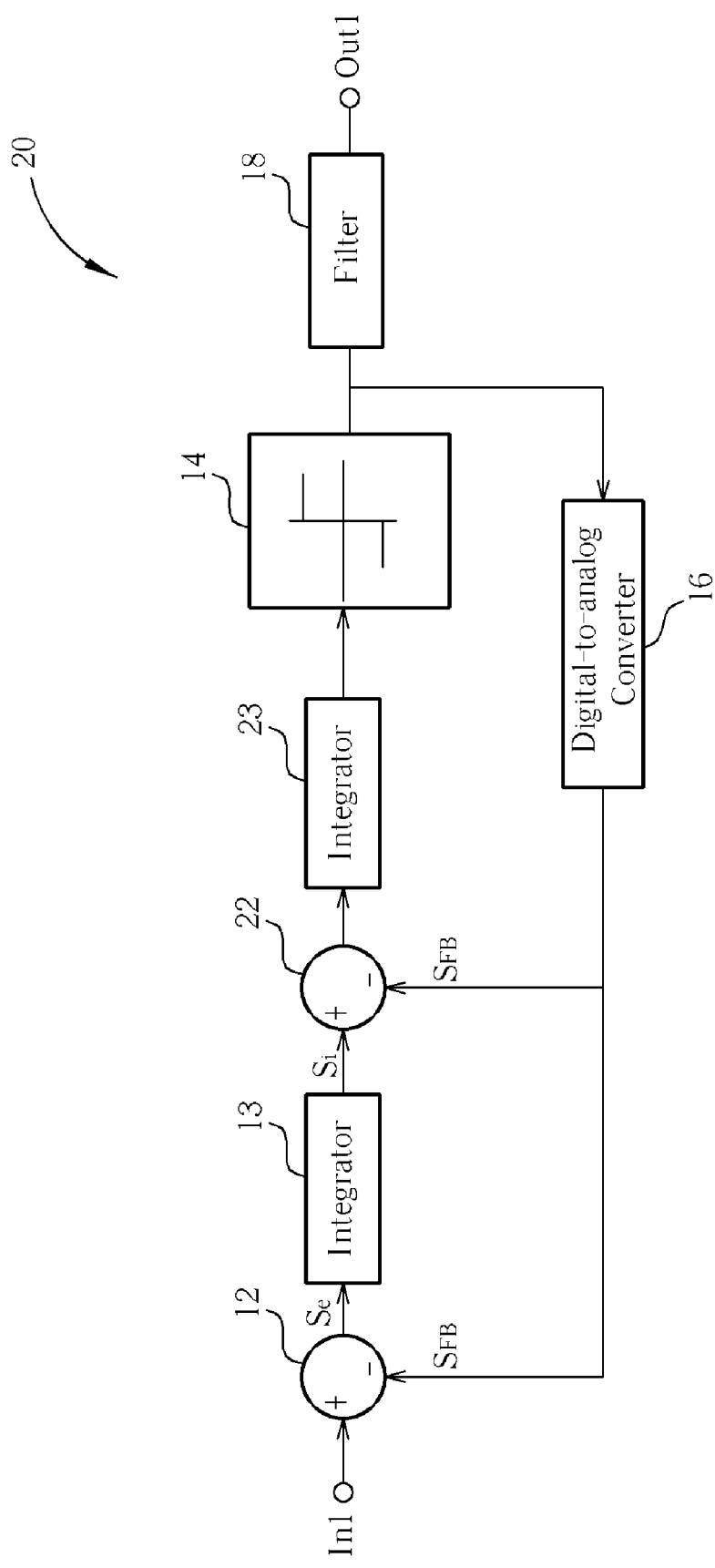
FIG. 2 is a diagram of a second order sigma-delta modulator in the prior art.
Figure 3:
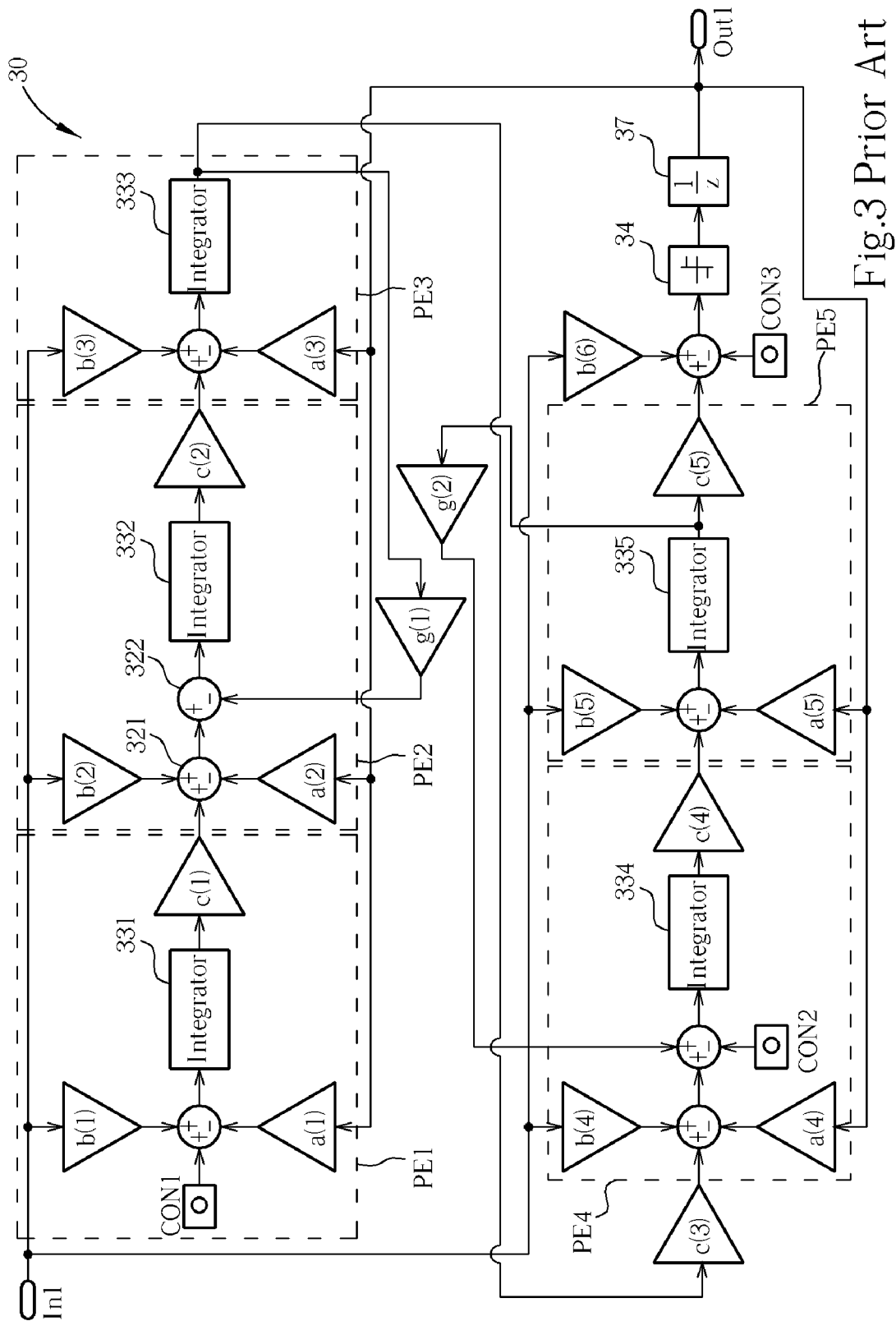
FIG. 3 is a diagram of a fifth order sigma-delta modulator in the prior art.
Figure 4:
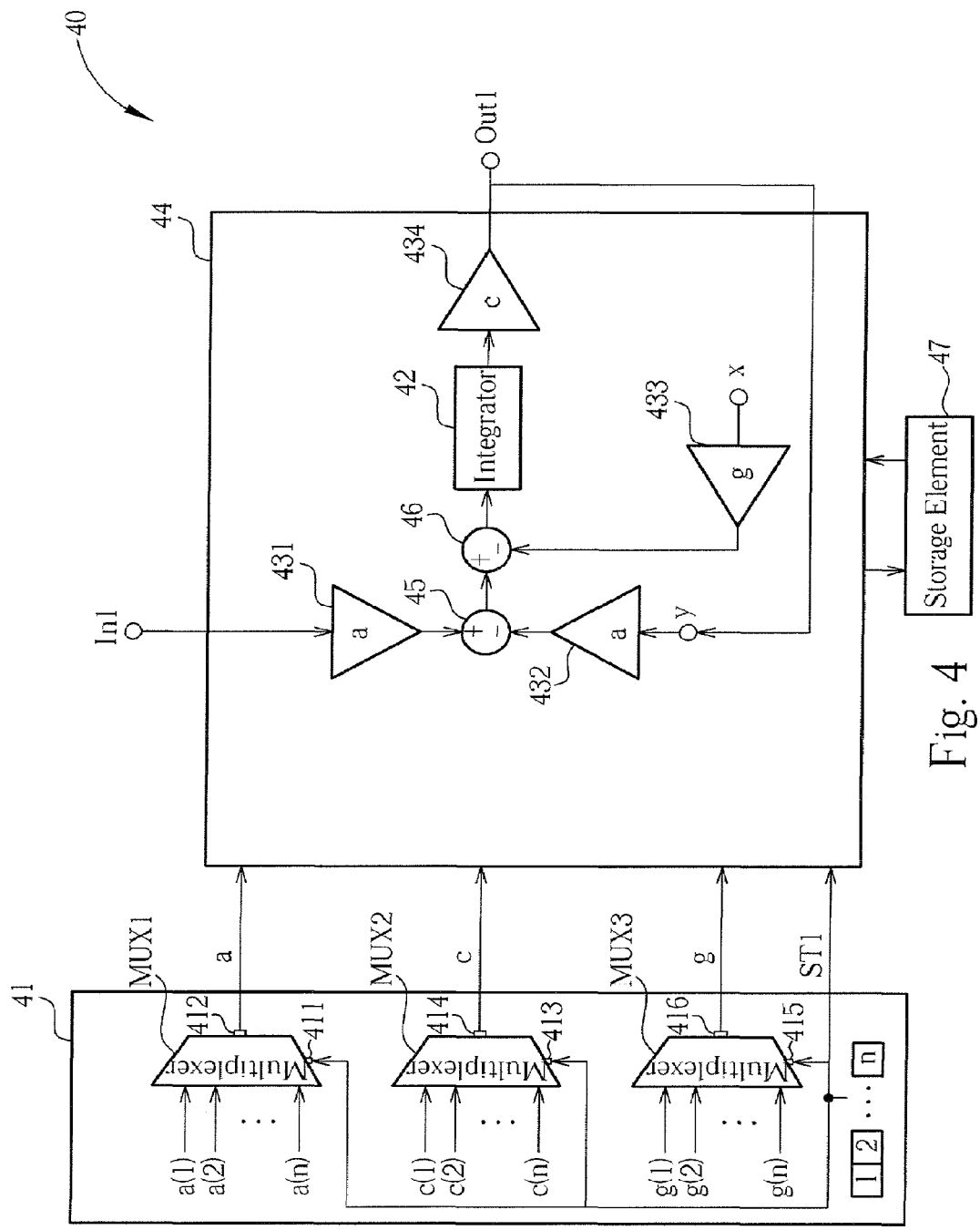
FIG. 4 is a diagram of a sigma-delta circuit with a time sharing architecture according to an embodiment of the present invention.

Please refer to FIG. 4. FIG. 4 is a diagram of a sigma-delta circuit 40 with a time sharing architecture according to an embodiment of the present invention. The sigma-delta circuit 40 includes a coefficient generation element 41, a sigma-delta processing element 44, and a storage element 47. The coefficient generation element 41 is used for generating coefficients a, c, and g for sigma-delta operations, and includes a first multiplexer MUX1, a second multiplexer MUX2, and a third multiplexer MUX3. The first multiplexer MUX1 includes n input ends, a control end 411, and an output end 412. The n input ends are used for receiving n coefficients a[1]~a[n], the control end 411 is used for receiving a state signal ST1, and the output end 412 is used for selecting one coefficient a from the n coefficients a[1]~a[n] to output. The second multiplexer MUX2 includes n input ends, a control end 413, and an output end 414. The n input ends are used for receiving n coefficients c[1]~c[n], the control end 413 is used for receiving the state signal ST1, and the output end 414 is used for selecting one coefficient c from the n coefficients c[1]~c[n] to output. The third multiplexer MUX3 includes n input ends, a control end 415, and an output end 416. The n input ends are used for receiving n coefficients g[1]~g[n], the control end 415 is used for receiving the state signal ST1, and the output end 416 is used for selecting one coefficient g from the n coefficients g[1]~g[n] to output. The sigma-delta processing element 44 is used for executing sigma-delta operations according to the coefficients a, c, and g generated by the coefficient generation element 41. The sigma-delta processing element 44 is a common sigma-delta processing element, which at least has a multiplier, an adder, and an integrator. As shown in FIG. 4, the sigma-delta processing element 44 has four multipliers 431, 432, 433, and 434, two adders 45 and 46, and an integrator 42. The coefficients of the four multipliers 431, 432, 433, and 434 are individually the coefficients a, a, g, c generated coefficient generation element 41. The output signal Out1 can be expressed in the following equation:

$$Out1 = \int\int [a \times (In1-y) - g \times x] \times c;$$

If five orders of sigma-delta operations are needed to be executed, assume that n=5. Thus different coefficients a, c, and g are utilized in each order of sigma-delta operation to complete five orders of sigma-delta operations. The storage element 47 is used for storing results of the sigma-delta operations executed by the sigma-delta processing element 44. The sigma-delta circuit 40 is used for executing a plurality of orders of sigma-delta operations through the coefficient generation element 41, the sigma-delta processing element 44 and the storage element 47. The storage element 47 is a random access memory (RAM).

Figure 5:
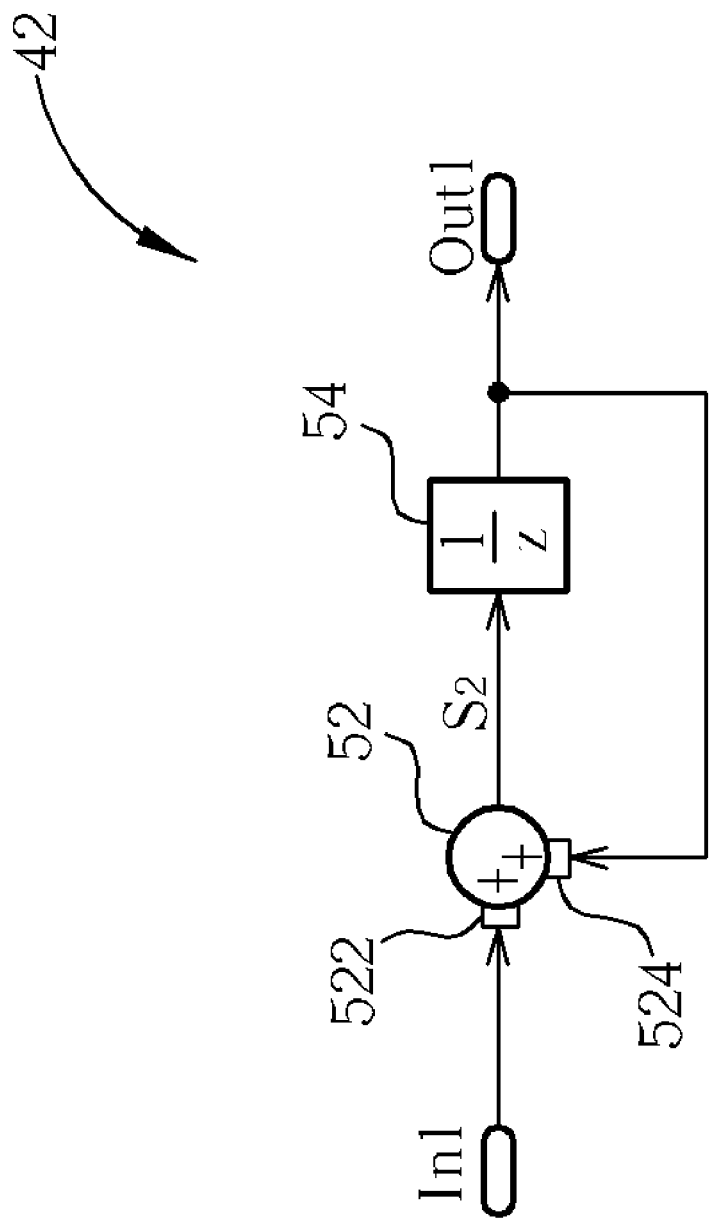
FIG. 5 is a diagram illustrating an embodiment of the integrator in FIG. 4.

Please refer to FIG. 5, which is a diagram illustrating an embodiment of the integrator 42 in FIG. 4. The integrator 42 includes an adder 52 and a delay unit 54, which form a feedback loop. The adder 52 includes two input ends 522 and 524, which are individually used for receiving an input signal In1 and a value of the previous output signal. After adding the input signal In1 to the value of the previous output signal, a second operation signal $S_2$ is generated. Then the second operation signal $S_2$ is delayed for a clock period by the delay unit 54 to generate the final output signal Out1.

Figure 6:
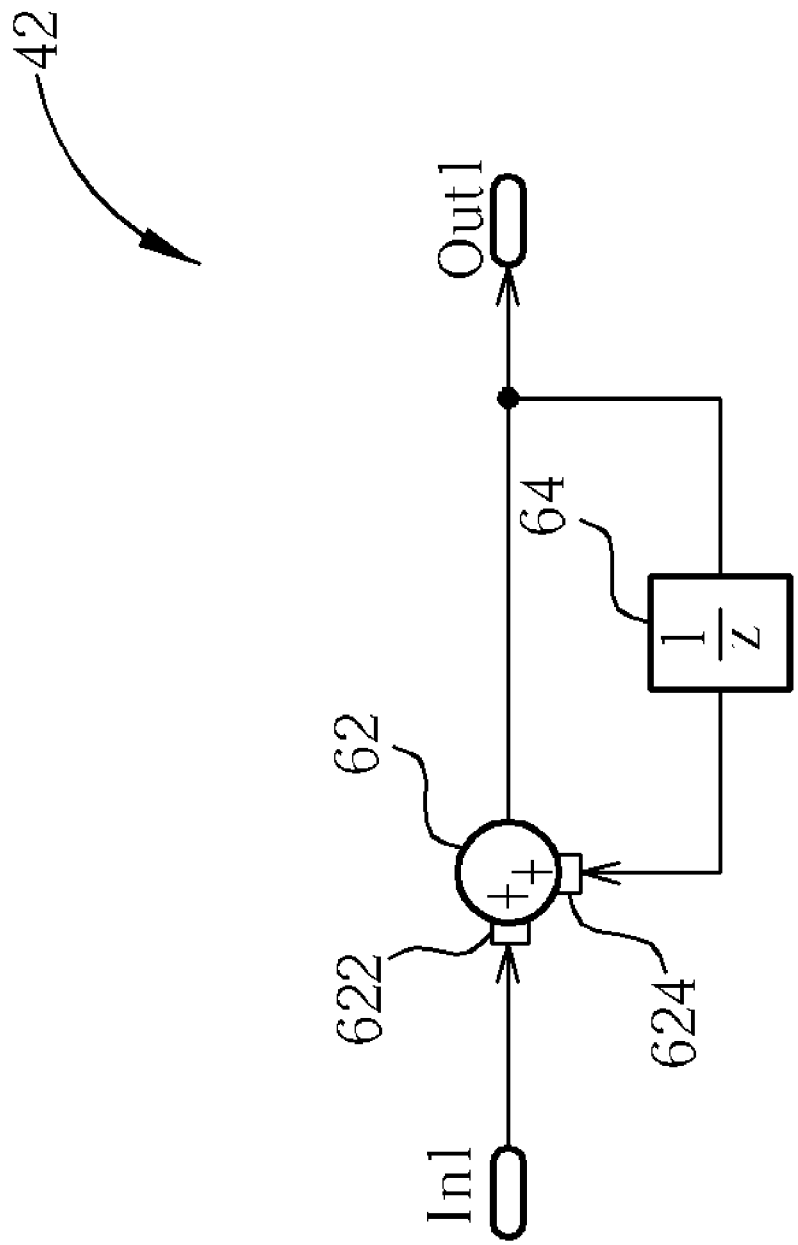
FIG. 6 is a diagram illustrating another embodiment of the integrator in FIG. 4.

Please refer to FIG. 6, which is a diagram illustrating another embodiment of the integrator 42 in FIG. 4. The integrator 42 includes an adder 62 and a delay unit 64, which form a feedback loop. The adder 62 includes a first input end 622 for receiving an input signal In1, and a second input end 624 coupled to an output end of the delay unit 64 for receiving a value of the previous output signal after delay of a clock period. After adding the input signal In1 to the value of the previous output signal after delay of a clock period, the final output signal Out1 is generated.

Thus it can be seen from FIG. 5 and FIG. 6, the architecture of the integrator can be viewed as an adder as well as a delay unit. Hence, the sigma-delta processing element 44 in FIG. 4 can be simplified into an adder as well as a multiplier, and a plurality of multiplexers and a plurality of delay units are collocated to execute operations with different orders. As a result, more adders and more multipliers can be reduced to save more hardware areas further.

Figure 7:
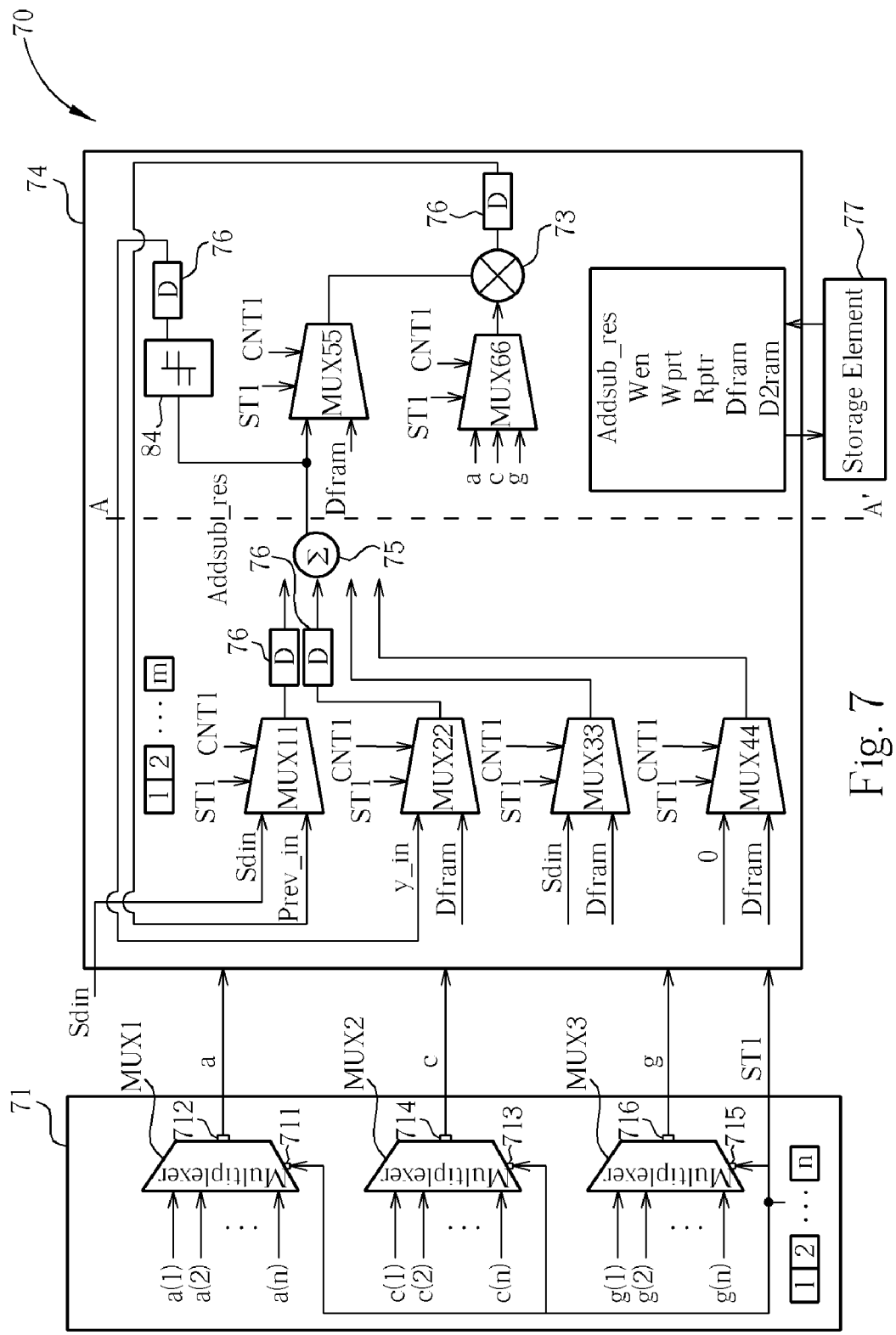
FIG. 7 is a diagram of a sigma-delta circuit with a time sharing architecture according to another embodiment of the present invention.

Please refer to FIG. 7. FIG. 7 is a diagram of a sigma-delta circuit 70 with a time sharing architecture according to another embodiment of the present invention. The sigma-delta circuit 70 includes the coefficient generation element 71, a sigma-delta processing element 74, and the storage element 77. The coefficient generation element 71 is used for generating coefficients a, c, and g for sigma-delta operations and includes a first multiplexer MUX1, a second multiplexer MUX2, and a third multiplexer MUX3. The operational principles of the first multiplexer MUX1, the second multiplexer MUX2, and the third multiplexer MUX3 are the same as the embodiment in FIG. 4 and are not explained anymore. The sigma-delta processing element 74 is used for executing sigma-delta operations according to the coefficients a, c, and g generated by the coefficient generation element 71. The sigma-delta processing element 74 is a sigma-delta processing unit after simplification, which has a multiplier 73, an adder 75, four delay units 76, six multiplexers MUX11~MUX66, and a quantizer 84. The storage unit 77 is used for storing the results of the sigma-delta operations of the sigma-delta processing element 74, in this embodiment, a plurality of parameters addsub_res, wne, wptr, rptr, dfram, and d2ram can be stored. On the left side of a dotted line AA', the sigma-delta processing element 74 is used for selecting which parameter to process an addition operation through the multiplexers MUX11~MUX44; and on the right side of the dotted line AA', one of the coefficients a, c, and g generated by the coefficient generation element 71 is selected by the multiplexer MUX66 and one parameter is selected by the multiplexer MUX55 to enter the multiplier 73 to process a multiplication operation. The delay unit 76 in FIG. 7 is used for delaying for a clock period. The quantizer 84 is used for quantizing the results of sigma-delta operations. The sigma-delta processing element 74 can save the amount of the multipliers 73 and the adders 75 through the selection of the plurality of multiplexers MUX11~MUX66. The sigma-delta circuit 70 is used for executing a plurality of orders of sigma-delta operations through the coefficient generation element 71, the sigma-delta processing element 74 and the storage element 77. The delay unit 76 is a D-type flip flop, and the storage element 77 is a random access memory (RAM).

Figure 8:
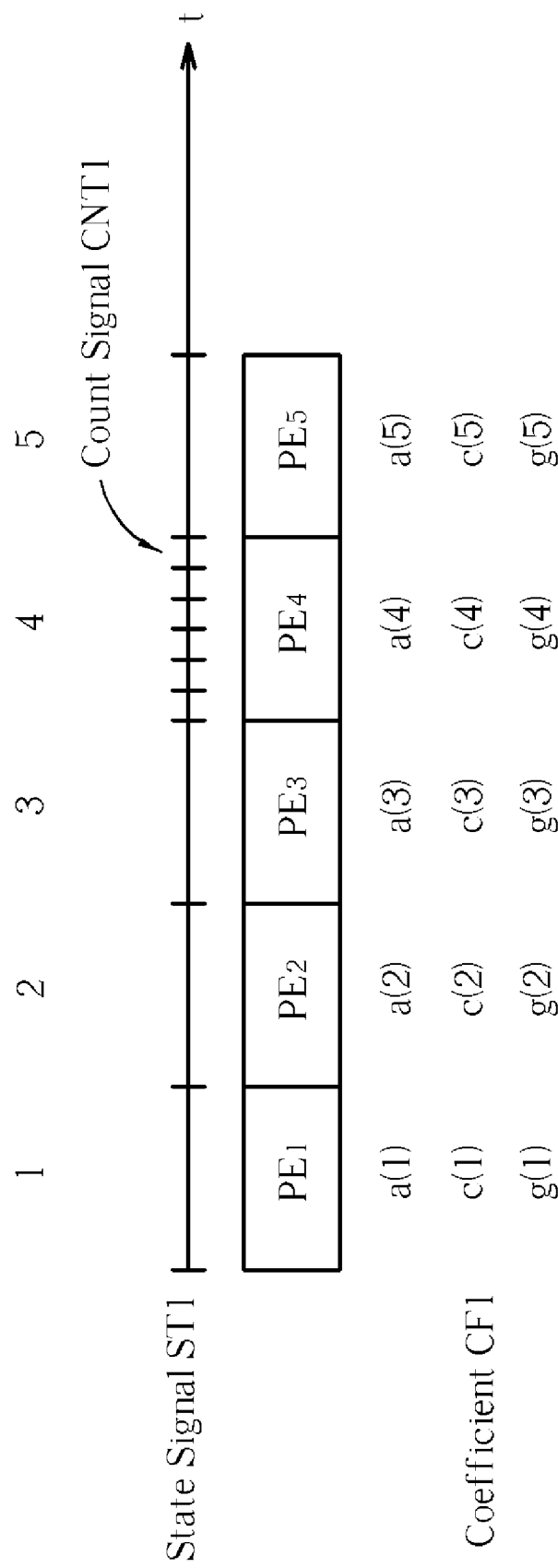
FIG. 8 is a diagram illustrating operations of the sigma-delta circuit with a time sharing architecture.

FIG. 8 is a diagram illustrating operations of the sigma-delta circuit with a time sharing architecture. A time axle t is divided into five stages 1, 2, 3, 4, and 5, which are used for executing sigma-delta operations by five sigma-delta processing elements PE1~PE5. The current state stage can be selected by the state signal ST1, and a wanted operation (such as an addition operation or a multiplication operation) during each stage can be selected by a count signal CNT1. Different coefficients in different states are generated through the coefficient generation element 41. For example, in the first state, the coefficients a(1), c(1), and g(1) are generated. To reason by analogy, the coefficients a(5), c(5), and g(5) are generated in the fifth state. Hence, only one sigma-delta processing unit 74 is needed for executing sigma-delta operations with different orders (different states) by way of the time sharing architecture. The plurality of multiplexers MUX11~MUX66 and the count signal CNT1 are utilized to further save the amount of the multipliers and the adders in circuits. Only one multiplier and one adder are used for executing different addition operations or multiplication operations to complete the sigma-delta operations.

Figure 9:
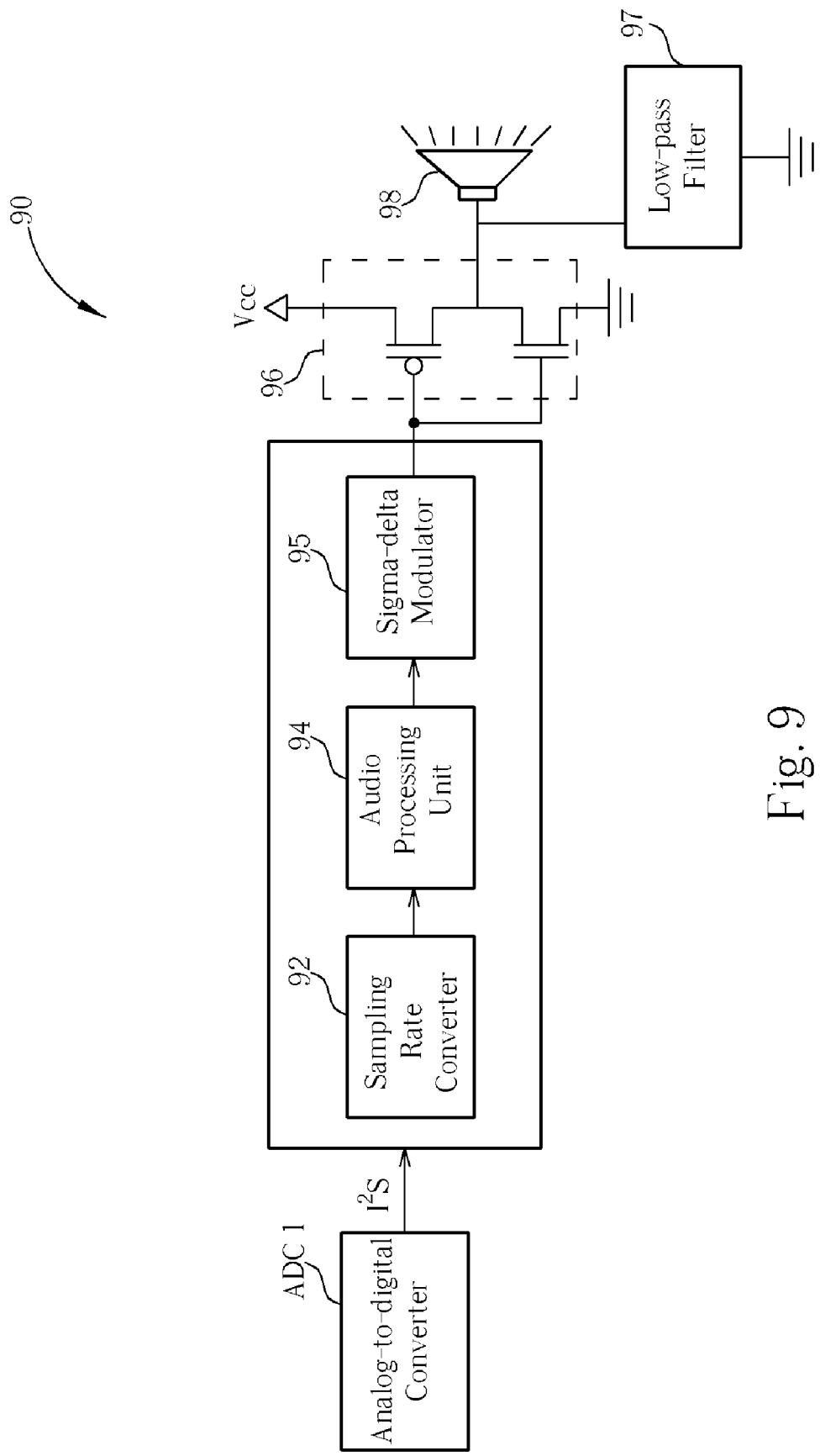
FIG. 9 is a diagram of an audio processing architecture.

Please refer to FIG. 9 that is a diagram of an audio processing architecture 90. The audio processing architecture 90 includes an analog-to-digital converter ADC1, a sampling rate converter 92, an audio processing unit 94, a sigma-delta modulator 95, an amplifier 96, a low-pass filter 97, and a loudspeaker 98. The analog-to-digital converter ADC1 is used for transforming signals into a digital format, such as $I^2S$ (inter-IC sound). The Inter Integrated-circuit Sound digital format $I^2S$ is processed a sampling rate transformation or re-sampled by the sampling rate converter 92 first, processed by the audio processing unit 94, and then processed sigma-delta operations by the sigma-delta modulator 95. The sigma-delta modulator 95 can be the sigma-delta circuit 40 in FIG. 4 or the sigma-delta circuit 70 in FIG. 7, which utilizes the time sharing architecture to reduce the amount of the adders and the multipliers. The signal outputted by the sigma-delta modulator 95 is submitted to the amplifier 96, which can be a D class amplifier or an AB class amplifier. Finally, signals are transmitted to the loudspeaker 98 to be played. The loudspeaker 98 is a horn, and the low-pass filter 97 is coupled between the amplifier 96 and the loudspeaker 98 for filtering noise.

Figure 10:
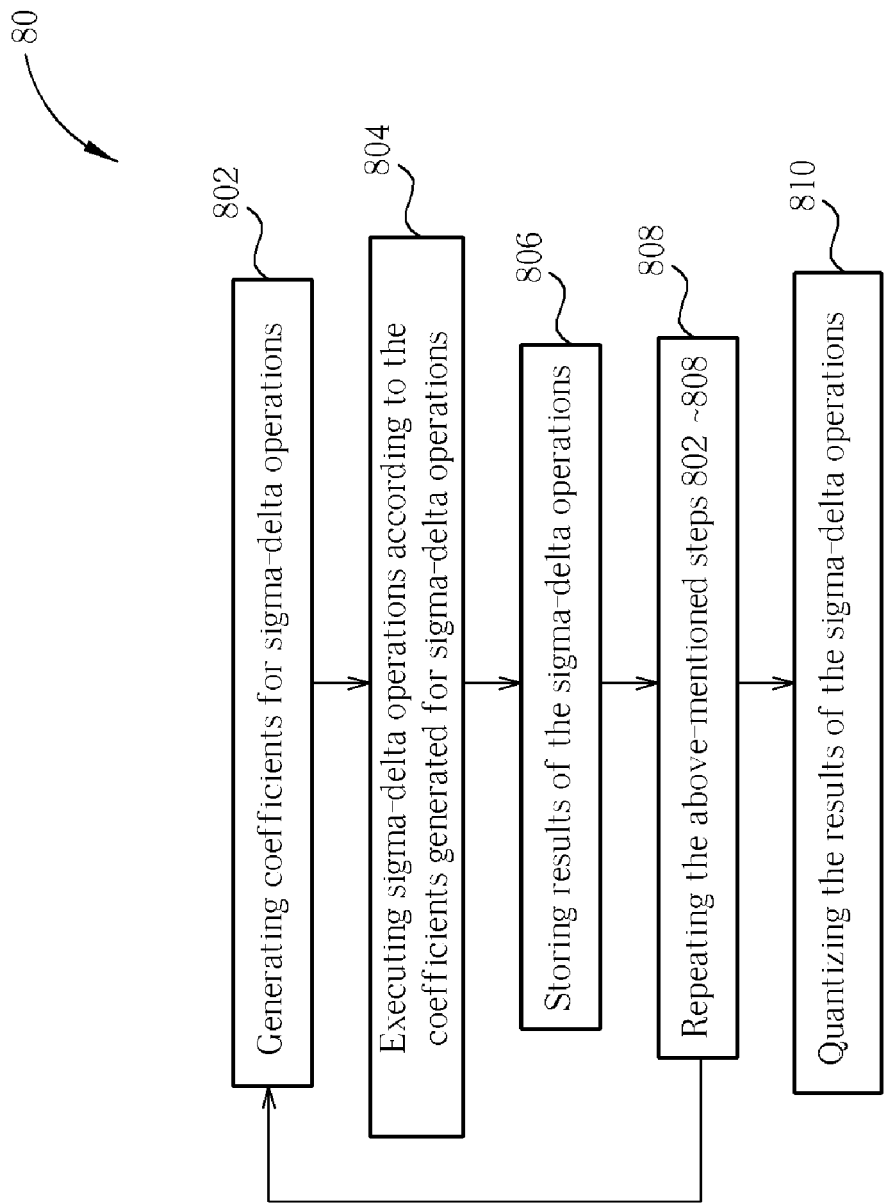
FIG. 10 is a diagram illustrating a flow of a method of utilizing a time sharing architecture to process audio signals in a sigma-delta circuit according to an embodiment of the present invention.

Please refer to FIG. 10. FIG. 10 is a diagram illustrating a flow 80 of a method of utilizing a time sharing architecture to process audio signals in a sigma-delta circuit according to an embodiment of the present invention. The flow 80 can be expressed in the following steps:

Step 802: Generating coefficients for sigma-delta operations.

Step 804: Executing sigma-delta operations according to the coefficients generated for sigma-delta operations.

Step 806: Storing results of the sigma-delta operations.

Step 808: Repeating the above-mentioned steps 802~808.

Step 810: Quantizing the results of the sigma-delta operations.

In step 802, through the application of a multiplexer, one coefficient can be selected from the plurality of coefficients according to the current state and the wanted operation. In step 804, the sigma-delta operations are executed according to the coefficients generated for sigma-delta operations. In step 806, the results of the sigma-delta operations are stored in a memory. In step 808, due to n orders sigma-delta operations being needed, each coefficient for each sigma-delta operation should be generated repeatedly. In step 810, the final results are quantized after all sigma-delta operations are completed to finish a complete signal flow. The generation of the coefficients for the sigma-delta operations are controlled by an state signal ST1, and the states of the sigma-delta operations and the wanted operations are controlled by the state signal ST1 and the count signal CNT1.

The abovementioned embodiments are presented merely for describing the present invention, and in no way should be considered to be limitations of the scope of the present invention. The delay unit 76 is not limited to the D-type flip flop only and can be a delay unit of another type. The storage element 47 is not restricted to a random access memory only, and can be other storage devices. The amount of the multiplexers included in the coefficient generation element 41 is corresponding to the amount of the coefficients for sigma-delta operations and is not limited to three multiplexers only. The sigma-delta circuit 40 and the sigma-delta circuit 70 both utilize the time sharing architecture. The difference between them is that the sigma-delta circuit 70 can save more adders and multipliers through the usage of the plurality of multiplexers MUX11~MUX66. But the above-mentioned embodiments are merely used for illustrating exemplifications of the present invention and are not limited to one of them only.

From the above descriptions, the present invention provides a sigma-delta circuit with the time sharing architecture. Among the sigma-delta circuit 40 and the sigma-delta circuit 70, different coefficients for different states and for different wanted operations are generated by the coefficient generation element 41, and the plurality of sigma-delta operations can be executed sequentially through the control of the state signal ST1 and the count signal CNT1. More adders and multipliers can be saved through the usage of the plurality of multiplexers MUX11~MUX66. As a result, more sigma-delta processing elements can be omitted and more components such as the adders and the multipliers can be saved, which can prevent wasting hardware area and cost. Furthermore, operational frequencies can be controlled in a reasonable range. For example, a general audio sampling rate is 44.1 KHz, if five orders of sigma-delta operations are needed and each order of sigma-delta operation includes five wanted steps, the operational frequency is (44.1 K*5*5) Hz, which can still be implemented in FPGA.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sigma-delta circuit with a time sharing architecture comprising:
a coefficient generation element used for generating coefficients for sigma-delta operations;
a sigma-delta processing element used for executing sigma-delta operations according to the coefficients generated by the coefficient generation element; and a storage element used for storing results of the sigma-delta operations executed by the sigma-delta processing element;

wherein the sigma-delta circuit is used for executing a plurality of orders of sigma-delta operations, and each order of sigma-delta operation is executed through the coefficient generation element, the sigma-delta processing element and the storage element.

2. The sigma-delta circuit of claim 1, wherein the coefficient generation element further comprises a plurality of multiplexers, each multiplexer comprising:
a plurality of input ends used for receiving a plurality of coefficients;
a control end used for receiving a state signal; and
an output end used for selecting one of the plurality of coefficients to output according to the state signal corresponding to the order of sigma-delta operation.

3. The sigma-delta circuit of claim 1, wherein the sigma-delta processing element comprises:
an adder having a first input end, a second input end, and an output end, the first input end used for receiving an input signal, the second input end used for receiving an output signal, and the adder used for processing an addition operation on the input signal and the output signal to generate an operation signal; and
an integrator having an input end coupled to the output end of the adder for receiving the operation signal, and an output end coupled to the second input end of the adder, the integrator used for processing an integration operation on the operation signal to generate the output signal.

4. The sigma-delta circuit of claim 3, wherein the integrator comprises:
an adder having a first input end, a second input end, and an output end, the first input end used for receiving the operation signal, the second input end used for receiving the output signal, and the adder used for processing an addition operation on the operation signal and the output signal to generate a second operation signal; and
a delay having an input end coupled to the output end of the adder for receiving the second operation signal and an output end coupled to the second input end of the adder, and the delay used for delaying the second operation signal for a clock period to generate the output signal.

5. The sigma-delta circuit of claim 4, wherein the delay is a D type flip-flop used for latching the second operation signal and outputting the output signal at a next clock.

6. The sigma-delta circuit of claim 3, wherein the sigma-delta processing element further comprises a quantizer coupled to the output end of the integrator, the quantizer used for quantizing the output signal.

7. The sigma-delta circuit of claim 3, wherein the sigma-delta processing element further comprises a second multiplexer, the second multiplexer comprising:
a first input end coupled to the output end of the adder for receiving operation results of the adder;
a second input end coupled to the storage element for receiving the previous sigma-delta operation result of the sigma-delta processing element;
two control ends used for receiving the state signal and a count signal individually; and
an output end used for selecting to output the operation results of the adder or the previous sigma-delta operation result of the sigma-delta processing element according to the state signal and the count signal received at the two control ends.

8. The sigma-delta circuit of claim 7, wherein the sigma-delta processing element further comprises a third multiplexer coupled to the output end of the coefficient generation element, the third multiplexer used for selecting one of the plurality of coefficients to output according to the state signal and the count signal.

9. The sigma-delta circuit of claim 8, wherein the sigma-delta processing element further comprises a multiplier, the multiplier comprising:
a first input end coupled to the output end of the third multiplexer for receiving the coefficients outputted by the third multiplexer;
a second input end coupled to the second multiplexer for receiving the operation results of the adder or the previous sigma-delta operation result of the sigma-delta processing element; and
an output end;
wherein the multiplexer is used for processing a multiplication operation on the coefficients outputted by the third multiplexer by the operation results of the adder or the previous sigma-delta operation result of the sigma-delta processing element to generate the sigma-delta operation results.

10. The sigma-delta circuit of claim 1, wherein the storage element is a memory.

11. The sigma-delta circuit of claim 1, wherein the storage element is a random access memory (RAM).

12. A method of utilizing a time sharing architecture to process audio signals in a sigma-delta circuit, the method comprising:
operating the sigma-delta circuit according to the time sharing architecture; and
utilizing the sigma-delta circuit, operated according to the time sharing architecture, to execute a plurality of orders of sigma-delta operations, wherein each order of sigma-delta operation is executed through following steps:
generating coefficients for sigma-delta operations;
executing sigma-delta operations according to the coefficients generated for sigma-delta operations; and
storing results of the sigma-delta operations.

13. The method of claim 12 further comprising:
receiving a plurality of coefficients;
receiving a state signal; and
selecting one of the plurality of coefficients to output according to the state signal corresponding to the order of sigma-delta operation.

14. The method of claim 12, wherein the step of executing the sigma-delta operations according to the coefficients generated for sigma-delta operations comprises:
receiving an input signal and an output signal, and processing an addition operation on the input signal and the output signal to generate an operation signal; and
processing an integration operation on the operation signal to generate the output signal.

15. The method of claim 14, wherein the step of processing the integration operation on the operation signal to generate the output signal comprises:
processing an addition operation on the operation signal and the output signal to generate a second operation signal; and
delaying the second operation signal for a clock period to generate the output signal.

16. The method of claim 15, wherein the step of delaying the second operation signal for a clock period comprises latching the second operation signal and outputting the output signal at a next clock.

17. The method of claim 14, further comprising:
quantizing the output signal.

18. The method of claim 14, wherein the step of executing the sigma-delta operations according to the coefficients generated for sigma-delta operations further comprises:
   receiving operation results of the addition operation;
   receiving the previous sigma-delta operation result;
   receiving the state signal and a count signal; and
   selecting to output the operation results of the addition operation or the previous sigma-delta operation result according to the state signal and the count signal.

19. The method of claim 18, wherein the step of executing the sigma-delta operations according to the coefficients generated for sigma-delta operations further comprises selecting one of the plurality of coefficients to output according to the state signal and the count signal.

20. The method of claim 19, wherein the step of executing the sigma-delta operations according to the coefficients generated for sigma-delta operations further comprises:
   receiving the coefficient selected according to the state signal and the count signal;
   receiving the operation results of the addition operation or the previous sigma-delta operation result; and
   processing a multiplication operation on the coefficient selected according to the state signal and the count signal by the operation results of the addition operation or the previous sigma-delta operation result to generate the sigma-delta operation results.

* * * * *